(12) United States Patent
Mandal (10) Patent No.: US 10,854,594 B2
(45) Date of Patent: Dec. 1, 2020

(54) ELECTROSTATIC DISCHARGE CIRCUIT FOR CROSS DOMAIN ESD PROTECTION

(71) Applicant: Microsoft Technology Licensing, LLC, Redmond, WA (US)

(72) Inventor: Gurupada Mandal, San Jose, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 162 days.

(21) Appl. No.: 15/994,390

(22) Filed: May 31, 2018

(65) Prior Publication Data

US 2019/0371787 A1 Dec. 5, 2019

(51) Int. Cl.
*H01L 27/02* (2006.01)
*H02H 9/04* (2006.01)
*H05K 1/02* (2006.01)

(52) U.S. Cl.
CPC ...... *H01L 27/0266* (2013.01); *H01L 27/0255* (2013.01); *H01L 27/0288* (2013.01); *H02H 9/046* (2013.01); *H01L 27/027* (2013.01); *H01L 27/0248* (2013.01); *H05K 1/0259* (2013.01)

(58) Field of Classification Search
CPC . H02H 9/046; H01L 27/0248; H01L 27/0266; H01L 27/027; H05K 1/0259
USPC ...................... 361/56, 88, 90, 111
See application file for complete search history.

(56) References Cited

U.S. PATENT DOCUMENTS

| | | | |
|---|---|---|---|
| 6,236,250 B1 | 5/2001 | Salmon et al. | |
| 6,671,153 B1 | 12/2003 | Ker et al. | |
| 6,756,834 B1 | 6/2004 | Tong et al. | |
| 7,420,789 B2 | 9/2008 | Chen | |
| 7,529,070 B2 | 5/2009 | Bhattacharya et al. | |
| 7,649,214 B2 | 1/2010 | Chen | |
| 7,656,627 B2 * | 2/2010 | Ker | H01L 27/0266 361/56 |

(Continued)

FOREIGN PATENT DOCUMENTS

CN 101228629 A 7/2008

OTHER PUBLICATIONS

Chen, et al., "Active ESD Protection Design for Interface Circuits between Separated Power Domains against Cross-Power-Domain ESD Stresses", In Journal of IEEE Transactions on Device and Materials Reliability, vol. 8, No. 3, Sep. 2008, pp. 549-560.

(Continued)

*Primary Examiner* — Gary A Nash
(74) *Attorney, Agent, or Firm* — International IP Law Group, PLLC (57) ABSTRACT

In one example, an electrostatic discharge (ESD) protection circuit includes a first power supply having a first supply voltage, wherein the first power supply is connected to a first node. The ESD protection circuit also includes a second power supply having a second supply voltage, wherein the second power supply is connected to the first node. The ESD protection circuit also includes an inverter that receives an input voltage from the first node and produces an output voltage. An ESD discharge device receives the output voltage and provides a discharge path for the first power supply and the second power supply if the output voltage indicates occurrence of an ESD event affecting the first power supply or the second power supply.

18 Claims, 4 Drawing Sheets

(56) References Cited

U.S. PATENT DOCUMENTS

| | | | |
|---|---|---|---|
| 7,742,265 B2* | 6/2010 | Rice | H01L 27/0266 |
| | | | 361/56 |
| 7,817,386 B2 | 10/2010 | Ker et al. | |
| 8,068,319 B1* | 11/2011 | Chan | H01L 27/0292 |
| | | | 361/111 |
| 8,169,758 B2 | 5/2012 | Mrcarica et al. | |
| 8,643,988 B1 | 2/2014 | Kwong | |
| 8,767,360 B2 | 7/2014 | Lin et al. | |
| 8,848,326 B2 | 9/2014 | Lai et al. | |
| 8,976,497 B2 | 3/2015 | Lefferts et al. | |
| 9,069,924 B2 | 6/2015 | Chen | |
| 9,647,452 B2 | 5/2017 | Chen et al. | |
| 2004/0264080 A1 | 12/2004 | Yang et al. | |
| 2012/0033335 A1 | 2/2012 | Wang et al. | |
| 2012/0162832 A1 | 6/2012 | Wang et al. | |
| 2013/0286516 A1 | 10/2013 | Prabhu et al. | |
| 2014/0376135 A1 | 12/2014 | Huo et al. | |
| 2015/0043113 A1 | 2/2015 | Yang et al. | |
| 2015/0194418 A1 | 7/2015 | Bade et al. | |
| 2016/0225758 A1 | 8/2016 | Lai et al. | |
| 2018/0047720 A1 | 2/2018 | Lai et al. | |

OTHER PUBLICATIONS

Ker, et al., "CDM ESD Protection in CMOS Integrated Circuits", In Proceedings of the Argentine School of Micro-Nanoelectronics, Technology and Applications, Sep. 18, 2008, pp. 61-66.

Lin, et al., "Design of local ESD clamp for cross-power-domain interface circuits", In Journal of IEICE Electronics Express, vol. 13, Issue 20, Oct. 7, 2016, pp. 1-6.

"International Search Report and Written Opinion Issued in PCT Application No. PCT/US2019/032335", dated Aug. 19, 2019, 12 Pages.

* cited by examiner

ELECTROSTATIC DISCHARGE CIRCUIT FOR CROSS DOMAIN ESD PROTECTION

BACKGROUND

Computer devices can experience an electrostatic discharge (ESD) event in a number of situations. In some examples, the ESD event can result from static electricity, electrostatic induction, and energetic charged particles impinging on a computing device. The ESD can damage any number of circuits within a computing device. For example, the ESD can damage a processor, a graphics processing unit, a data bus, and the like.

SUMMARY

The following presents a simplified summary in order to provide a basic understanding of some aspects described herein. This summary is not an extensive overview of the claimed subject matter. This summary is not intended to identify key or critical elements of the claimed subject matter nor delineate the scope of the claimed subject matter. This summary's sole purpose is to present some concepts of the claimed subject matter in a simplified form as a prelude to the more detailed description that is presented later.

An embodiment described herein includes an ESD protection circuit that can include a first power supply having a first supply voltage, the first power supply connected to a first node through a first diode. The ESD protection circuit can also include a second power supply having a second supply voltage, the second power supply connected to the first node through a second diode. Additionally, the ESD protection circuit can include an inverter that receives an input voltage from the first node and produces an output voltage, and an ESD discharge device that receives the output voltage and provides a discharge path for the first power supply and the second power supply if the output voltage indicates occurrence of an ESD event affecting the first power supply or the second power supply.

In another embodiment, a method for manufacturing an ESD protection circuit can include manufacturing an ESD protection circuit having a first power supply to provide a first supply voltage, the first power supply connected to a first node. The method can also include adding a second power supply to provide a second supply voltage, the second power supply connected to the first node. Additionally, the method can include adding an inverter to the ESD protection circuit, the inverter to receive an input voltage from the first node and to produce an output voltage. Furthermore, the method can include adding an electrostatic discharge (ESD) discharge device to the ESD protection circuit, the ESD discharge device to receive the output voltage and to provide a discharge path for the first power supply and the second power supply if the output voltage indicates occurrence of an ESD event affecting the first power supply or the second power supply.

In another embodiment, a method of operating an ESD protection circuit that has a first power supply that provides a first supply voltage, the first power supply connected to a first node, a second power supply that provides a second supply voltage, the second power supply connected to the first node, and an inverter that receives an input voltage from the first node and produces an output voltage, can include receiving an electrostatic discharge (ESD) strike at either the first power supply or the second power supply. The method can also include driving, in response to the ESD strike, the output voltage to indicate an ESD event, receiving the output voltage at an ESD discharge device, and providing, in response to the output voltage, a discharge path for the first power supply and the second power supply.

The following description and the annexed drawings set forth in detail certain illustrative aspects of the claimed subject matter. These aspects are indicative, however, of a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

BRIEF DESCRIPTION OF THE DRAWINGS

The following detailed description may be better understood by referencing the accompanying drawings, which contain specific examples of numerous features of the disclosed subject matter.

DETAILED DESCRIPTION

The techniques described herein can protect a computing device or other electronic device against an electrostatic discharge (ESD) event by incorporating an ESD discharge device in at least one ESD protection circuit. An ESD event is a rapid application of a positive or negative voltage to an electric circuit. The voltage level of the ESD event typically significantly exceeds the level of voltage that the circuit is designed to handle. ESD events or strikes can be produced by static shocks, short circuits, dielectric breakdown and the like. ESD events may be positive or negative, depending on the polarity of the ESD voltage.

An ESD protection circuit, as referred to herein, can provide a discharge path to any sort of circuitry, including a SOC, ASIC, general purpose processor, a graphics processing unit, and the like. As discussed above, an ESD event can permanently damage any number of integrated circuits within a computing device. Accordingly, an ESD discharge device can protect against an ESD event. Specifically, the ESD discharge circuit can provide a low impedance discharge path before the device containing the ESD discharge device sustains damage.

In some embodiments, an ESD protection circuit can include a first power supply having a first supply voltage. In some examples, the first power supply can be connected to a first node. The ESD protection circuit can also include a second power supply having a second supply voltage, wherein the second power supply is also connected to the first node. In some examples, the first power supply and the second power supply are connected to the first node through separate diodes. The ESD protection circuit can also include an inverter that receives an input voltage from the first node and produces an output voltage. The ESD protection circuit can also include an ESD discharge device that receives the output voltage and provides a discharge path for the first power supply and the second power supply if the output voltage indicates an occurrence of an ESD event affecting the first power supply or the second power supply.

Accordingly, the ESD protection circuit described herein includes an ESD discharge device that protects an integrated circuit against ESD events. The ESD protection circuit can be used between two different power supplies with different voltages or the same voltages. For example, the ESD protection circuit can protect core supplies operating with any suitable voltage and input/output (I/O) supplies operating with any suitable voltage. Furthermore, the ESD protection circuit described herein can include any suitable combination of power supplies of higher voltages and lower voltages, wherein the power supplies can begin ramping up in any suitable order.

Figure 1:
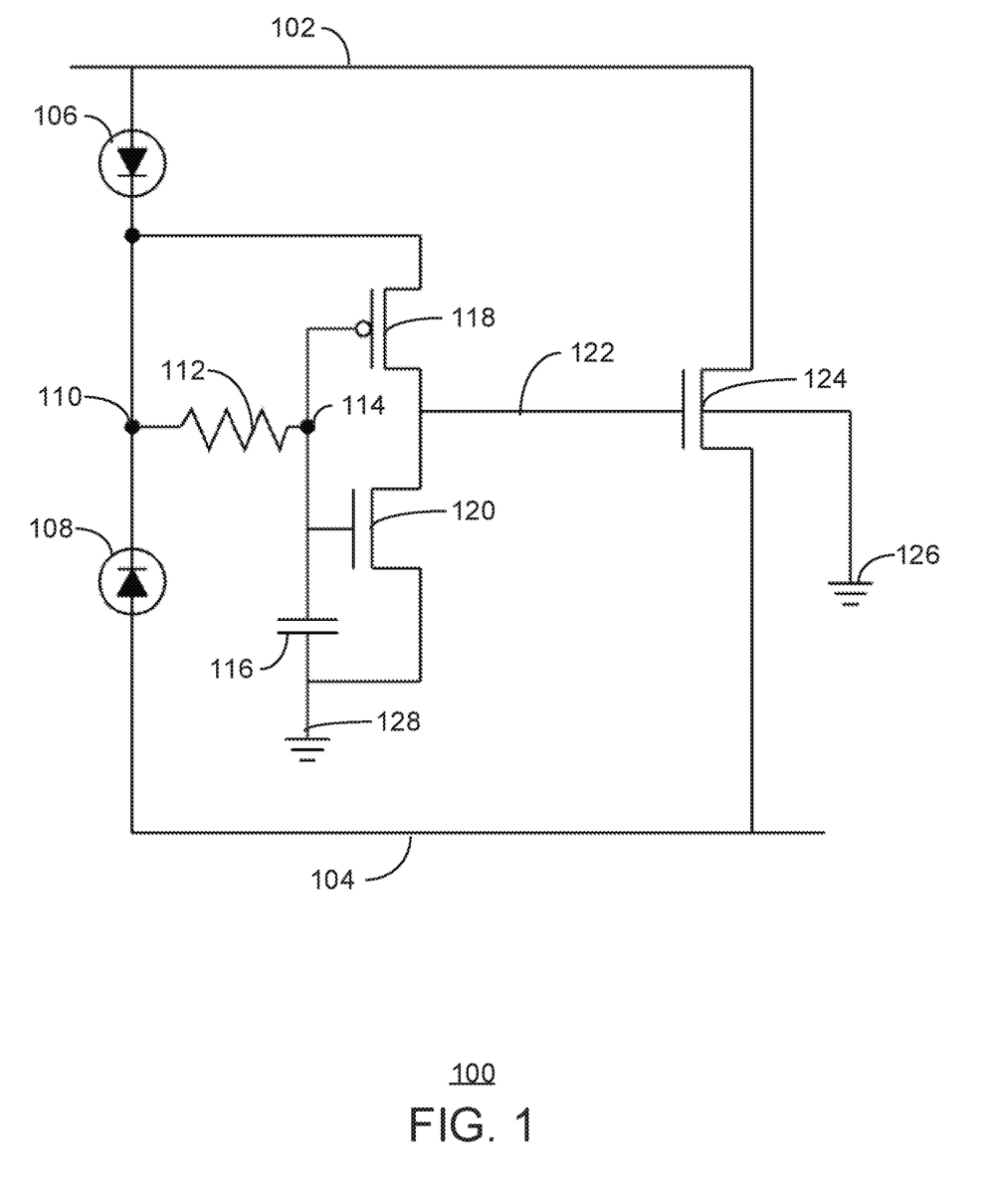
FIG. 1 illustrates an example circuit that provides a discharge path to an ESD event.

FIG. 1 shows an example ESD protection circuit 100 that can discharge an ESD strike to an integrated circuit without damaging the device containing the ESD protection circuit 100. In some embodiments, the ESD protection circuit 100 can include any number of power supplies such as $V_{DDA}$ 102 and $V_{DDB}$ 104. Each of the power supplies $V_{DDA}$ 102 and $V_{DDB}$ 104 can provide different voltages to the circuit 100. For example, the voltage provided by the power supply $V_{DDA}$ 102 can be higher than the voltage provided by the power supply $V_{DDB}$ 104. Alternatively, the voltage provided by the power supply $V_{DDA}$ 102 can be lower than the voltage provided by the power supply $V_{DDB}$ 104.

In some embodiments, the ESD protection circuit 100 can include diodes, such as D1 106 and D2 108, between the power supplies $V_{DDA}$ 102 and $V_{DDB}$ 104 and a node n1 110. The circuit 100 can also include a resistor 112 between node n1 110 and node n2 114. An electrical signal can be transmitted from n2 114 to a capacitor 116, a P-type metal-oxide-semiconductor (PMOS) transistor 118, and an N-type metal-oxide-semiconductor (NMOS) transistor 120. In some examples, the substrate of the PMOS transistor 118 is tied to its source terminal, similarly the substrate of the NMOS transistor 120 is tied to its source terminal. The PMOS transistor 118 and NMOS transistor 120 can operate to invert the electrical signal to enable transmission along node Vgate 122 to a second NMOS transistor NM2 124 with substrate connected to a ground 126. Moreover, the second NMOS transistor NM2 124 can operate as an ESD discharge device to discharge an ESD event from one of the system power supplies to the other supply. In some examples, a separate ground connection 128 can be connected to the capacitor 116. The operation of the ESD protection circuit 100 in various power states of the power supplies $V_{DDA}$ 102 and $V_{DDB}$ 104 is explained below.

In one example, the ESD protection circuit 100 is not powered up and there is a positive ESD event. As the ESD protection circuit 100 is not powered up yet, the internal nodes n1 110, n2 114, and Vgate 122 are each at 0 volts. The power supply $V_{DDA}$ 102 can be at a positive ESD voltage with respect to power supply $V_{DDB}$ 104. During this ESD event (sometimes referred to as a zap), the diode D1 106 can be forward biased, and the voltage at node n1 110 is one diode drop lower than the voltage level on power supply $V_{DDA}$ 102. In this example, the voltage at the node n2 114, which was initially at 0 volts, will only start rising very slowly due to an "RC" effect to the same level to node n1 110. As a result, the PMOS transistor 118 and NMOS transistor 120 can invert the electrical signal and drive the Vgate 122 to high immediately, which can turn on the second NMOS transistor 124. Accordingly, the NMOS transistor 124 can provide a discharge path from power supply $V_{DDA}$ 102 to power supply $V_{DDB}$ 104 and the ground connection 126. In some examples, a similar event occurs when power supply $V_{DDB}$ 104 receives a positive ESD voltage or zap with respect to power supply $V_{DDA}$ 102. Specifically, the ESD event or voltage can be transmitted via the second NMOS transistor 124 to ground connection 126 to protect the ESD protection circuit 100 from damage.

In another example, the ESD protection circuit 100 is not powered up and there is a negative ESD event. In this example, the power supply $V_{DDA}$ 102 transfers a negative ESD voltage with respect to power supply $V_{DDB}$ 104. When the power supply $V_{DDA}$ 102 has a negative ESD voltage, the diode D1 106 is reverse biased. In this example, node n1 110 and node n2 114 can remain at 0 volts. Also, the voltage of node Vgate 122 is 0 volts in this example. The second NMOS NM2 124 in this example has a voltage of 0 volts at its gate terminal (Vgate 122) when its source terminal is at the same negative voltage as the power supply source $V_{DDA}$ 102. The second NMOS transistor NM2 124 can turn on and provide the discharge path between the two power supplies ($V_{DDA}$ 102 and $V_{DDB}$ 104). In some embodiments, a parasitic diode between the substrate and the source diffusion of NMOS transistor NM2 124 can be forward biased and provide another discharge path from the power supply $V_{DDA}$ 102 to the ground connection 126. In some examples, a similar event occurs when the power supply $V_{DDB}$ 104 receives a negative ESD voltage with respect to power supply $V_{DDA}$ 102. Specifically, the NMOS transistor NM2 124 can provide a discharge path from the power supply $V_{DDB}$ 104 to supply $V_{DDA}$ and also to the ground connection 126.

In yet another example, when one or both power supplies $V_{DDA}$ 102 and $V_{DDB}$ 104 are ramped up, the voltage on nodes n1 110 and n2 114 are the same as the higher supply voltage and the voltage at Vgate 122 is 0 volts. If there is a positive EDS event, node n1 110 will be immediately at one diode drop lower than the ESD voltage and node n2 114 will still be at the initial higher supply voltage. As a result, the PMOS transistor 118 and NMOS transistor 120 can invert the electrical signal and drive the node Vgate 122 to high, which can turn on the second NMOS transistor NM2 124. Accordingly, the NMOS transistor NM2 124 can provide a discharge path from power supply $V_{DDA}$ 102 to power supply $V_{DDB}$ 104.

Moreover, in one example, when the one or both power supplies $V_{DDA}$ 102 and $V_{DDB}$ 104 are powered up and there is a negative ESD event, the initial voltage on nodes n1 110 and n2 114 can be the same as the higher supply voltage. Additionally, in this example, the voltage of node Vgate 122 is 0 volts. The second NMOS transistor NM2 124 can turn on and provide the discharge path between the two power supplies $V_{DDA}$ 102 and $V_{DDB}$ 104. A parasitic diode between the substrate and the source diffusion of NMOS transistor NM2 124 can be forward biased and provide another discharge path from the zapped supply to the ground connection 126

In an example in which there is no ESD event, the voltage at nodes n1 110 and n2 114 can be the same as the higher of the two power supplies $V_{DDA}$ 102 and $V_{DDB}$ 104. The node Vgate 122 can have a voltage of zero, which turns the second NMOS transistor 124 off. In some examples, if the VGS of the second NMOS transistor NM2 124 is at a negative value, the magnitude of that is the minimum voltage of power supply $V_{DDA}$ 102 and power supply $V_{DDB}$ 104. As a result, the second NMOS transistor NM2 124 has a negative gate over drive and this reduces the leakage of the second NMOS transistor NM2 124 significantly.

In one embodiment, the ESD protection circuit 100 in block diagram of FIG. 1 can include all of the components shown in FIG. 1. However, the ESD protection circuit 100 can also include fewer or additional components not illustrated in FIG. 1 (e.g., additional resistors, power supplies, capacitors, diodes, etc.).

Figure 2:
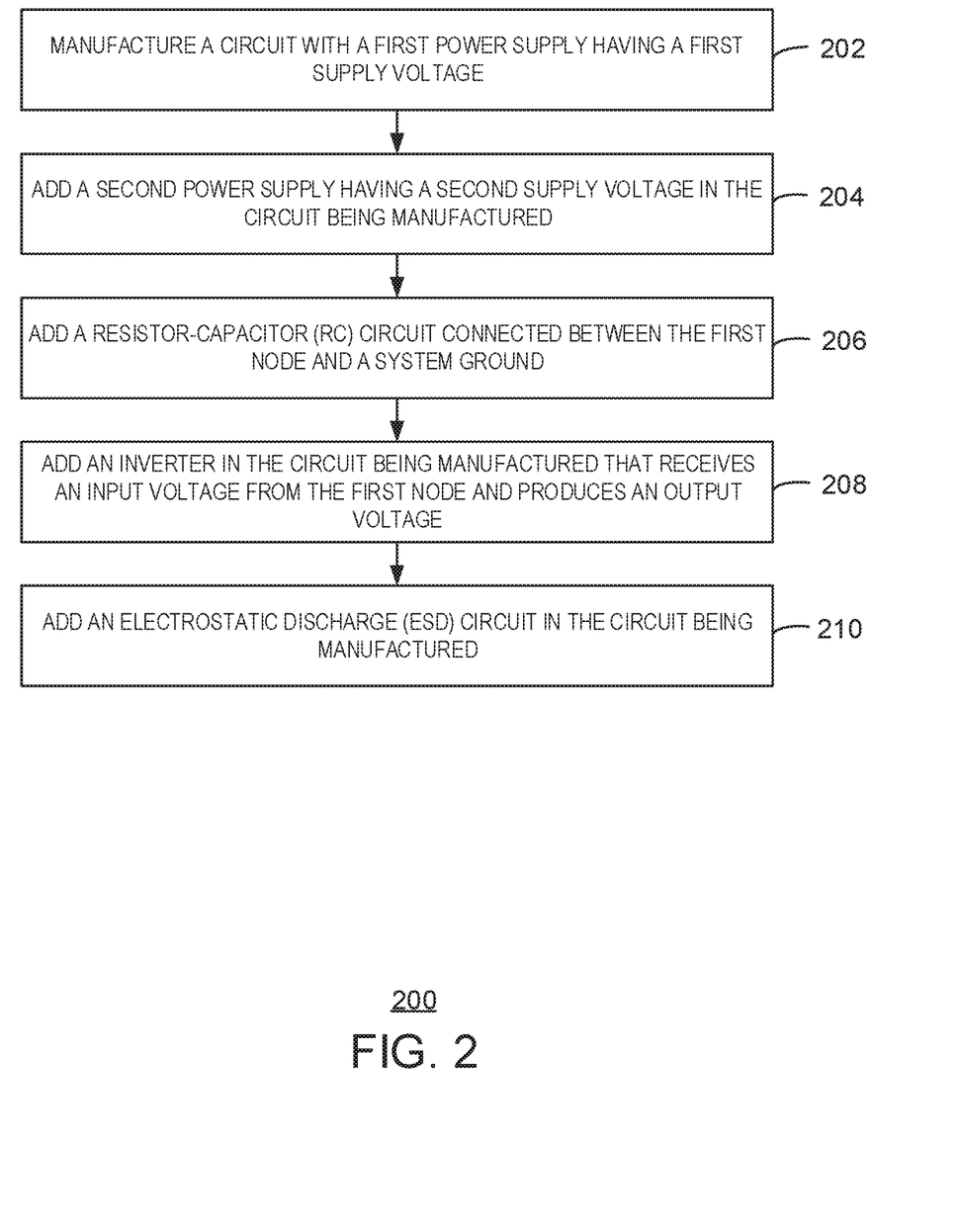
FIG. 2 is a process flow diagram of an example method for manufacturing a circuit to manage an ESD event with an NMOS transistor.

FIG. 2 is a process flow diagram of an example method for manufacturing a circuit to manage an ESD event with an ESD discharge device. The method 200 can be used to construct ESD protection circuits to be used to protect any suitable electronic device, such as the computing system 402 of FIG. 4, described below.

At block 202, an ESD protection circuit is manufactured with a first power supply having a first supply voltage. In some examples, the first power supply can be connected to a first node in the circuit. The first node can also be connected to a second power supply described below at block 204. In some examples, the first power supply can provide any suitable voltage or level of power to the circuit. In some embodiments, the circuit can include a first diode connected between the first power supply and the first node.

At block 204, the ESD protection circuit is manufactured to include a second power supply having a second supply voltage. In some examples, the second power supply is connected to the first node that is also connected to the first power supply. In some embodiments, the ESD protection circuit includes a second diode connected between the second power and the first node. In some examples, the second power supply can provide any suitable voltage or level of power to the ESD protection circuit. For example, the second power supply can provide a higher voltage or a lower voltage to the circuit than the first power supply.

At block 206, the ESD protection circuit is manufactured to include a resistor-capacitor (RC) circuit connected between the first node and a system ground. In some embodiments, the RC circuit can operate as a trigger that causes the input voltage to indicate occurrence of the ESD event. In some examples, the RC circuit can trigger when a fast-changing voltage such as an ESD event occurs. The ESD discharge device is represented above in FIG. 1 as the second NMOS transistor NM2 124. In some examples, the capacitor of the RC circuit serves as a short circuit when an ESD event occurs to enable the ESD circuit to be enabled as described in block 210 below.

At block 208, the ESD protection circuit is manufactured to include an inverter that receives an input voltage from the first node and produces an output voltage. In some embodiments, an input voltage to the inverter causes the output voltage to turn off the ESD discharge device when either the first power supply or the second power supply are turned on. In some embodiments, the output voltage of the inverter turns the ESD discharge device on to discharge a positive or negative ESD event if both the first power supply and the second power supply are turned off. In some embodiments, the output voltage of the inverter turns the ESD discharge device on to discharge a positive or negative ESD event if the first power supply and the second power supply are turned on. The inverter can include a NAND gate or a NOR gate.

At block 210, the ESD protection circuit is manufactured to include an ESD discharge device such as the second NMOS transistor NM2 124 (FIG. 1). The ESD discharge device can receive the output voltage and provide a discharge path for the first power supply and the second power supply if the output voltage indicates occurrence of an ESD event affecting the first power supply or the second power supply. As stated above, the ESD discharge device may comprise an N-type metal-oxide-semiconductor (NMOS) transistor. In some embodiments, the NMOS transistor turns on to discharge a negative ESD event if both the first power supply and the second power supply are turned off. In some examples, the NMOS transistor turns on to discharge a negative ESD event if either the first power supply or the second power supply are turned on, or if both the first power supply and the second power supply are turned on. The ESD discharge device can also include a P-type metal-oxide-semiconductor (PMOS) transistor with some appropriate changes. In some embodiments, the PMOS transistor turns on to discharge a positive ESD event if both the first power supply and the second power supply are turned off. In some examples, the PMOS transistor turns on to discharge a positive ESD event if either the first power supply or the second power supply are turned on, or if both the first power supply and the second power supply are turned on.

In one embodiment, the process flow diagram of FIG. 2 is intended to indicate that the blocks of the method 200 are to be executed in a particular order. Alternatively, in other embodiments, the blocks of the method 200 can be executed in any suitable order and any suitable number of the blocks of the method 200 can be included. Further, any number of additional blocks may be included within the method 200, depending on the specific application.

Figure 3:
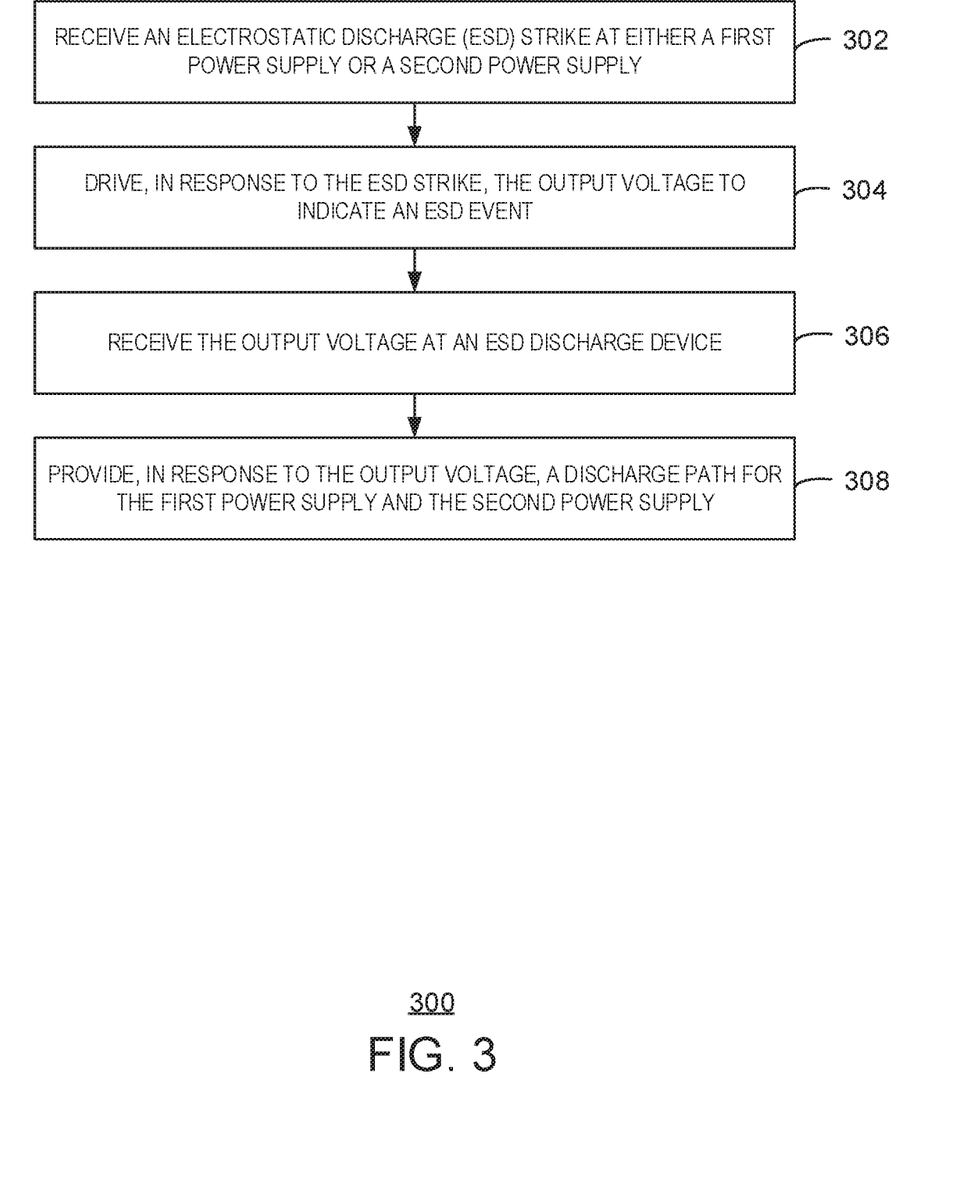
FIG. 3 is a process flow diagram of an example method for operating a device comprising an ESD protection circuit.

FIG. 3 is a process flow diagram of an example method for operating a device comprising an ESD protection circuit. The method 300 can be used to operate ESD protection circuits in any suitable electronic device, such as the computing system 402 of FIG. 4, described below. In some examples, the method 300 includes operating an ESD protection circuit that has a first power supply that provides a first supply voltage, wherein the first power supply is connected to a first node. The ESD protection circuit can also include a second power supply that provides a second supply voltage, wherein the second power supply is connected to the first node. Additionally, the ESD protection circuit can include an inverter that receives an input voltage from the first node and produces an output voltage. The method 300 of operating the ESD protection circuit is described below in relation to blocks 302-308.

At block 302, operating the ESD protection circuit can include receiving an electrostatic discharge (ESD) strike at either the first power supply or the second power supply. The ESD strike can include any rapid change in voltage transmitted to the first power supply or the second power supply such as static electricity discharge, and the like. In some examples, the first power supply and the second power supply can operate with different voltages.

At block 304, operating the ESD protection circuit can include driving, in response to the ESD strike, the output voltage to indicate an ESD event. For example, the output voltage from the ESD strike can be transmitted to an ESD discharge device within the ESD protection circuit.

At block 306, operating the ESD protection circuit can include receiving the output voltage at an ESD discharge device. In some embodiments, the ESD discharge device can include an NMOS transistor.

At block 308, operating the ESD protection circuit can include providing, in response to the output voltage, a discharge path for the first power supply and the second power supply. For example, the ESD protection circuit can enable the ESD discharge device to transmit the output voltage from the ESD strike to a ground connection.

In one embodiment, the process flow diagram of FIG. 3 is intended to indicate that the blocks of the method 300 are to be executed in a particular order. Alternatively, in other embodiments, the blocks of the method 300 can be executed in any suitable order and any suitable number of the blocks of the method 300 can be included. Further, any number of additional blocks may be included within the method 300, depending on the specific application. For example, the method 300 can include turning off the ESD discharge device when the output voltage no longer indicates an ESD event.

Figure 4:
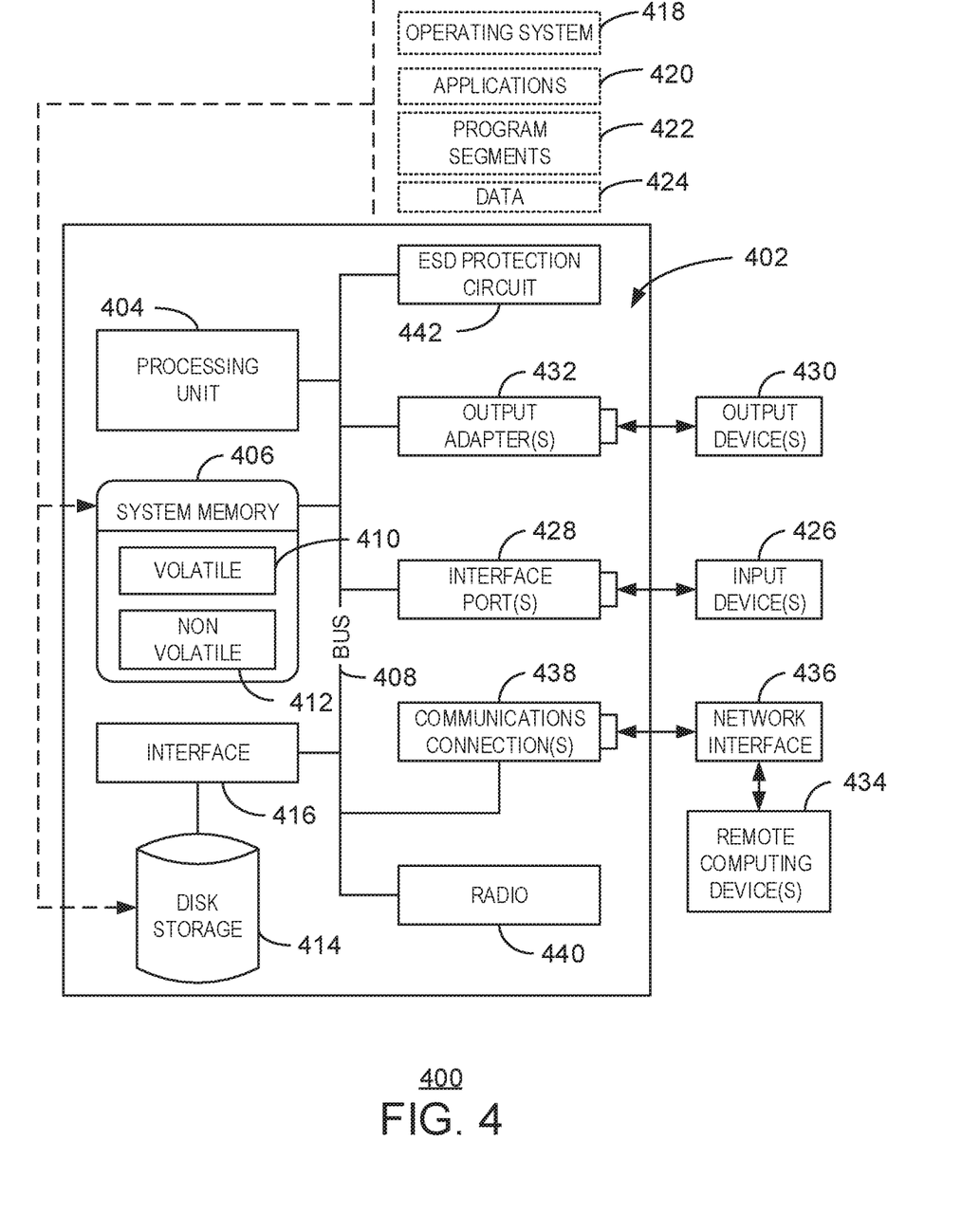
FIG. 4 is a block diagram of an example of a computing system that can include an ESD protection circuit with an NMOS transistor to protect against ESD events.

FIG. 4 is a block diagram of an example of a computing system that can include an ESD protection circuit with an ESD discharge device to protect against ESD events, as described herein. The example system 400 includes a computing device 402. The computing device 402 includes a processing unit 404, a system memory 406, and a system bus 408. In some examples, the computing device 402 can be a gaming console, a personal computer (PC), an accessory console, a gaming controller, among other computing devices. In some examples, the computing device 402 can be a node in a cloud network.

The system bus 408 connects various system components including, but not limited to, the system memory 406 to the processing unit 404. The processing unit 404 can be any of various available processors. Dual microprocessors and other multiprocessor architectures also can be employed as the processing unit 404.

The system bus 408 can be any of several types of bus structure, including the memory bus or memory controller, a peripheral bus or external bus, and a local bus using any variety of available bus architectures known to those of ordinary skill in the art. The system memory 406 includes computer-readable storage media that includes volatile memory 410 and nonvolatile memory 412.

In some embodiments, a unified extensible firmware interface (UEFI) manager or a basic input/output system (BIOS), containing the basic routines to transfer information between elements within the computer 402, such as during start-up, is stored in nonvolatile memory 412. By way of illustration, and not limitation, nonvolatile memory 412 can include read-only memory (ROM), programmable ROM (PROM), electrically programmable ROM (EPROM), electrically erasable programmable ROM (EEPROM), or flash memory.

Volatile memory 410 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), SynchLink™ DRAM (SLDRAM), Rambus® direct RAM (RDRAM), direct Rambus® dynamic RAM (DRDRAM), and Rambus® dynamic RAM (RDRAM).

The computer 402 also includes other computer-readable media, such as removable/non-removable, volatile/non-volatile computer storage media. FIG. 4 shows, for example a disk storage 414. Disk storage 414 includes, but is not limited to, devices like a magnetic disk drive, floppy disk drive, tape drive, Jaz drive, Zip drive, LS-210 drive, flash memory card, or memory stick.

In addition, disk storage 414 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 414 to the system bus 408, a removable or non-removable interface is typically used such as interface 416.

It is to be appreciated that FIG. 4 describes software that acts as an intermediary between users and the basic computer resources described in the suitable operating environment 400. Such software includes an operating system 418. Operating system 418, which can be stored on disk storage 414, acts to control and allocate resources of the computer 402.

System applications 420 take advantage of the management of resources by operating system 418 through program segments 422 and program data 424 stored either in system memory 406 or on disk storage 414. It is to be appreciated that the disclosed subject matter can be implemented with various operating systems or combinations of operating systems.

A user enters commands or information into the computer 402 through input devices 426. Input devices 426 include, but are not limited to, a pointing device, such as, a mouse, trackball, stylus, and the like, a keyboard, a microphone, a joystick, a satellite dish, a scanner, a TV tuner card, a digital camera, a digital video camera, a web camera, any suitable dial accessory (physical or virtual), and the like. In some examples, an input device can include Natural User Interface (NUI) devices. NUI refers to any interface technology that enables a user to interact with a device in a "natural" manner, free from artificial constraints imposed by input devices such as mice, keyboards, remote controls, and the like. In some examples, NUI devices include devices relying on speech recognition, touch and stylus recognition, gesture recognition both on screen and adjacent to the screen, air gestures, head and eye tracking, voice and speech, vision, touch, gestures, and machine intelligence. For example, NUI devices can include touch sensitive displays, voice and speech recognition, intention and goal understanding, and motion gesture detection using depth cameras such as stereoscopic camera systems, infrared camera systems, RGB camera systems and combinations of these. NUI devices can also include motion gesture detection using accelerometers or gyroscopes, facial recognition, three-dimensional (3D) displays, head, eye, and gaze tracking, immersive augmented reality and virtual reality systems, all of which provide a more natural interface. NUI devices can also include technologies for sensing brain activity using electric field sensing electrodes. For example, a NUI device may use Electroencephalography (EEG) and related methods to detect electrical activity of the brain. The input devices 426 connect to the processing unit 404 through the system bus 408 via interface ports 428. Interface ports 428 include, for example, a serial port, a parallel port, a game port, and a universal serial bus (USB).

Output devices 430 use some of the same type of ports as input devices 426. Thus, for example, a USB port may be used to provide input to the computer 402 and to output information from computer 402 to an output device 430.

Output adapter 432 is provided to illustrate that there are some output devices 430 like monitors, speakers, and printers, among other output devices 430, which are accessible via adapters. The output adapters 432 include, by way of illustration and not limitation, video and sound cards that provide a means of connection between the output device 430 and the system bus 408. It can be noted that other devices and systems of devices provide both input and output capabilities such as remote computing devices 434.

The computer 402 can be a server hosting various software applications in a networked environment using logical connections to one or more remote computers, such as remote computing devices 434. The remote computing devices 434 may be client systems configured with web browsers, PC applications, mobile phone applications, and the like. The remote computing devices 434 can be a personal computer, a server, a router, a network PC, a workstation, a microprocessor based appliance, a mobile phone, a peer device or other common network node and the like, and typically includes many or all of the elements described relative to the computer 402.

Remote computing devices 434 can be logically connected to the computer 402 through a network interface 436 and then connected via a communication connection 438, which may be wireless. Network interface 436 encompasses wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection 438 refers to the hardware/ software employed to connect the network interface 436 to the bus 408. While communication connection 438 is shown for illustrative clarity inside computer 402, it can also be external to the computer 402. The hardware/software for connection to the network interface 436 may include, for exemplary purposes, internal and external technologies such as, mobile phone switches, modems including regular telephone grade modems, cable modems and DSL modems, ISDN adapters, and Ethernet cards.

The computer 402 can further include a radio 440. For example, the radio 440 can be a wireless local area network radio that may operate one or more wireless bands. For example, the radio 440 can operate on the industrial, scientific, and medical (ISM) radio band at 2.4 GHz or 5 GHz. In some examples, the radio 440 can operate on any suitable radio band at any radio frequency.

In some embodiments, the computer 402 includes an ESD protection circuit 442. The ESD protection circuit 442 can include a first power supply having a first supply voltage, wherein the first power supply is connected to a first node. The ESD protection 442 can also include a second power supply having a second supply voltage, wherein the second power supply is connected to the first node. The ESD protection circuit 442 can also include an inverter that receives an input voltage from the first node and produces an output voltage. The ESD protection circuit 442 can also include an ESD discharge device that receives the output voltage and provides a discharge path for the first power supply and the second power supply if the output voltage indicates occurrence of an ESD event affecting the first power supply or the second power supply.

It is to be understood that the block diagram of FIG. 4 is not intended to indicate that the computing system 402 is to include all of the components shown in FIG. 4. Rather, the computing system 402 can include fewer or additional components not illustrated in FIG. 4 (e.g., additional applications, additional segments, additional memory devices, additional network interfaces, etc.). Furthermore, any of the functionalities of the ESD protection circuit 442 may be partially, or entirely, implemented in hardware and/or in the processing unit (also referred to herein as a processor) 404. For example, the functionality may be implemented with an application specific integrated circuit, in logic implemented in the processing unit 404, or in any other device.

Example 1

An embodiment described herein includes an ESD protection circuit that can include a first power supply having a first supply voltage, the first power supply connected to a first node through a first diode. The ESD protection circuit can also include a second power supply having a second supply voltage, the second power supply connected to the first node through a second diode. Additionally, the ESD protection circuit can include an inverter that receives an input voltage from the first node and produces an output voltage, and an ESD discharge device that receives the output voltage and provides a discharge path for the first power supply and the second power supply if the output voltage indicates occurrence of an ESD event affecting the first power supply or the second power supply.

Alternatively, or in addition, the ESD protection circuit can include a first diode connected between the first power supply and the first node and a second diode connected between the second power and the first node, wherein the input voltage to the inverter causes the output voltage to turn off the ESD discharge device when either the first power supply or the second power supply are turned on. Alternatively, or in addition, the ESD protection circuit can include a resistor-capacitor (RC) circuit connected between the first node and a system ground, the RC circuit operating as a trigger that causes the input voltage to indicate occurrence of the ESD event. Alternatively, or in addition, the ESD discharge device comprises an N-type metal-oxide-semiconductor (NMOS) transistor. Alternatively, or in addition, the NMOS transistor turns on to discharge a negative ESD event if both the first power supply and the second power supply are turned off. Alternatively, or in addition, the output voltage of the inverter turns the ESD discharge device on to discharge a positive ESD event if both the first power supply and the second power supply are at the first supply voltage and the second supply voltage, respectively, indicating that the ESD protection circuit is turned off. Alternatively, or in addition, the output voltage of the inverter turns the ESD discharge device on to discharge a positive ESD event if the first power supply and the second power supply are turned on. Alternatively, or in addition, the NMOS transistor turns on to discharge a negative ESD event if the first power supply and the second power supply are turned on. Alternatively, or in addition, the inverter comprises a NAND gate or a NOR gate.

Example 2

In another embodiment, a method for manufacturing an ESD protection circuit can include manufacturing an ESD protection circuit having a first power supply to provide a first supply voltage, the first power supply connected to a first node. The method can also include adding a second power supply to provide a second supply voltage, the second power supply connected to the first node. Additionally, the method can include adding an inverter to the ESD protection circuit, the inverter to receive an input voltage from the first node and to produce an output voltage. Furthermore, the method can include adding an electrostatic discharge (ESD) discharge device to the ESD protection circuit, the ESD discharge device to receive the output voltage and to provide a discharge path for the first power supply and the second power supply if the output voltage indicates occurrence of an ESD event affecting the first power supply or the second power supply.

Alternatively, or in addition, the method can include adding a first diode connected between the first power supply and the first node and adding a second diode connected between the second power and the first node, wherein the input voltage to the inverter causes the output voltage to turn off the ESD discharge device when either the first power supply or the second power supply are turned on. Alternatively, or in addition, the method can include adding a resistor-capacitor (RC) circuit connected between the first node and a system ground, the RC circuit operating as a trigger that causes the input voltage to indicate occurrence of the ESD event. Alternatively, or in addition, the ESD discharge device comprises an N-type metal-oxide-semiconductor (NMOS) transistor. Alternatively, or in addition, the NMOS transistor turns on to discharge a negative ESD event if both the first power supply and the second power supply are turned off. Alternatively, or in addition, the output voltage of the inverter turns the ESD discharge device on to discharge a positive ESD event if both the first power supply and the second power supply are at the first supply voltage and the second supply voltage, respectively, indicating that the ESD protection circuit is turned off. Alternatively, or in addition, the output voltage of the inverter turns the ESD discharge device on to discharge a positive ESD event if the first power supply and the second power supply are turned on. Alternatively, or in addition, the NMOS transistor turns on to discharge a negative ESD event if the first power supply and the second power supply are turned on. Alternatively, or in addition, the inverter comprises a NAND gate or a NOR gate.

Example 3

In another embodiment, a method of operating an ESD protection circuit that has a first power supply that provides a first supply voltage, the first power supply connected to a first node, a second power supply that provides a second supply voltage, the second power supply connected to the first node, and an inverter that receives an input voltage from the first node and produces an output voltage, can include receiving an electrostatic discharge (ESD) strike at either the first power supply or the second power supply. The method can also include driving, in response to the ESD strike, the output voltage to indicate an ESD event, receiving the output voltage at an ESD discharge device, and providing, in response to the output voltage, a discharge path for the first power supply and the second power supply. Alternatively, or in addition, the method includes turning off the ESD discharge device when the output voltage no longer indicates an ESD event.

Some of the figures describe concepts in the context of one or more structural components, referred to as functionalities, segments, features, elements, etc. The various components shown in the figures can be implemented in any manner, for example, by software, hardware (e.g., discrete logic components, etc.), firmware, and so on, or any combination of these implementations. In one embodiment, the various components may reflect the use of corresponding components in an actual implementation. In other embodiments, any single component illustrated in the figures may be implemented by a number of actual components. The depiction of any two or more separate components in the figures may reflect different functions performed by a single actual component. FIG. 4 discussed above, provides details regarding different systems that may be used to implement the functions shown in the figures.

Other figures describe the concepts in flowchart form. In this form, certain operations are described as constituting distinct blocks performed in a certain order. Such implementations are exemplary and non-limiting. Certain blocks described herein can be grouped together and performed in a single operation, certain blocks can be broken apart into plural component blocks, and certain blocks can be performed in an order that differs from that which is illustrated herein, including a parallel manner of performing the blocks. The blocks shown in the flowcharts can be implemented by software, hardware, firmware, and the like, or any combination of these implementations. As used herein, hardware may include computer systems, discrete logic components, such as application specific integrated circuits (ASICs), and the like, as well as any combinations thereof.

As for terminology, the phrase "configured to" encompasses any way that any kind of structural component can be constructed to perform an identified operation. The structural component can be configured to perform an operation using software, hardware, firmware and the like, or any combinations thereof. For example, the phrase "configured to" can refer to a logic circuit structure of a hardware element that is to implement the associated functionality. The phrase "configured to" can also refer to a logic circuit structure of a hardware element that is to implement the coding design of associated functionality of firmware or software. The term "segment" refers to a structural element that can be implemented using any suitable hardware (e.g., a processor, among others), software (e.g., an application, among others), firmware, or any combination of hardware, software, and firmware.

The term "logic" encompasses any functionality for performing a task. For instance, each operation illustrated in the flowcharts corresponds to logic for performing that operation. An operation can be performed using software, hardware, firmware, etc., or any combinations thereof.

As utilized herein, terms "component," "system," "client" and the like are intended to refer to a computer-related entity, either hardware, software (e.g., in execution), and/or firmware, or a combination thereof. For example, a component can be a process running on a processor, an object, an executable, a program, a function, a library, a subroutine, and/or a computer or a combination of software and hardware. By way of illustration, both an application running on a server and the server can be a component. One or more components can reside within a process and a component can be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any tangible, computer-readable device, or media.

Computer-readable storage media can include but are not limited to magnetic storage devices (e.g., hard disk, floppy disk, and magnetic strips, among others), optical disks (e.g., compact disk (CD), and digital versatile disk (DVD), among others), smart cards, and flash memory devices (e.g., card, stick, and key drive, among others). In contrast, computer-readable media generally (i.e., not storage media) may additionally include communication media such as transmission media for wireless signals and the like.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the claimed subject matter. In this regard, it will also be recognized that the innovation includes a system as well as a computer-readable storage media having computer-executable instructions for performing the acts and events of the various methods of the claimed subject matter.

There are multiple ways of implementing the claimed subject matter, e.g., an appropriate API, tool kit, driver code, operating system, control, standalone or downloadable software object, etc., which enables applications and services to use the techniques described herein. The claimed subject matter contemplates the use from the standpoint of an API (or other software object), as well as from a software or hardware object that operates according to the techniques set forth herein. Thus, various implementations of the claimed subject matter described herein may have aspects that are wholly in hardware, partly in hardware and partly in software, as well as in software.

The aforementioned systems have been described with respect to interoperation between several components. It can be appreciated that such systems and components can include those components or specified sub-components, some of the specified components or sub-components, and additional components, and according to various permutations and combinations of the foregoing. Sub-components can also be implemented as components communicatively coupled to other components rather than included within parent components (hierarchical).

Additionally, it can be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In addition, while a particular feature of the claimed subject matter may have been disclosed with respect to one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An electrostatic discharge (ESD) protection circuit, comprising:
    a first power supply having a first supply voltage, the first power supply connected to a first node through a first diode;
    a second power supply having a second supply voltage, the second power supply connected to the first node through a second diode;
    an inverter that receives an input voltage from the first node and produces an output voltage;
    an ESD discharge device that receives the output voltage and provides a discharge path for the first power supply and the second power supply if the output voltage indicates occurrence of an ESD event affecting the first power supply or the second power supply; and
    a resistor-capacitor (RC) circuit connected between the first node and a system ground, the RC circuit operating as a trigger that causes the input voltage to indicate occurrence of the ESD event.

2. The ESD protection circuit of claim 1, comprising:
    the first diode connected between the first power supply and the first node;
    the second diode connected between the second power supply and the first node; and
    wherein the input voltage to the inverter causes the output voltage to turn off the ESD discharge device when either the first power supply or the second power supply are turned on.

3. The ESD protection circuit of claim 1, wherein the ESD discharge device comprises an N-type metal-oxide-semiconductor (NMOS) transistor.

4. The ESD protection circuit of claim 3, wherein the NMOS transistor turns on to discharge a negative ESD event if both the first power supply and the second power supply are turned off.

5. The ESD protection circuit of claim 3, wherein the NMOS transistor turns on to discharge a negative ESD event if the first power supply and the second power supply are turned on.

6. The ESD protection circuit of claim 1, wherein the output voltage of the inverter turns the ESD discharge device on to discharge a positive ESD event if both the first power supply and the second power supply are at the first supply voltage and the second supply voltage, respectively, indicating that the ESD protection circuit is turned off.

7. The ESD protection circuit of claim 1, wherein the output voltage of the inverter turns the ESD discharge device on to discharge a positive ESD event if the first power supply and the second power supply are turned on.

8. The ESD protection circuit of claim 1, wherein the inverter comprises a NAND gate or a NOR gate.

9. A method for manufacturing electrostatic discharge (ESD) protection circuits, comprising:
    manufacturing an ESD protection circuit having a first power supply to provide a first supply voltage, the first power supply connected to a first node;
    adding a second power supply to provide a second supply voltage, the second power supply connected to the first node;
    adding an inverter to the ESD protection circuit, the inverter to receive an input voltage from the first node and to produce an output voltage;
    adding an ESD discharge device to the ESD protection circuit, the ESD discharge device to receive the output voltage and to provide a discharge path for the first power supply and the second power supply if the output voltage indicates occurrence of an ESD event affecting the first power supply or the second power supply; and
    adding a resistor-capacitor (RC) circuit to the ESD protection circuit, wherein the RC circuit is connected between the first node and a system ground, the RC circuit operating as a trigger that causes the input voltage to indicate occurrence of the ESD event.

10. The method of claim 9, comprising:
    adding a first diode to the ESD protection circuit, wherein the first diode is connected between the first power supply and the first node;
    adding a second diode to the ESD protection circuit, wherein the second diode is connected between the second power supply and the first node; and wherein the input voltage to the inverter causes the output voltage to turn off the ESD circuit when either the first power supply or the second power supply are turned on.

11. The method of claim 9, wherein the ESD discharge device comprises an N-type metal-oxide-semiconductor (NMOS) transistor.

12. The method of claim 11, wherein the NMOS transistor turns on to discharge a negative ESD event if both the first power supply and the second power supply are turned off.

13. The method of claim 11, wherein the NMOS transistor turns on to discharge a negative ESD event if the first power supply and the second power supply are turned on.

14. The method of claim 9, wherein the output voltage of the inverter turns the ESD discharge device on to discharge a positive ESD event if both the first power supply and the second power supply are turned off.

15. The method of claim 9, wherein the output voltage of the inverter turns the ESD discharge device on to discharge a positive ESD event if the first power supply and the second power supply are turned on.

16. The method of claim 9, wherein the inverter comprises a NAND gate or a NOR gate.

17. A method of operating an electrostatic discharge (ESD) protection circuit that has a first power supply that provides a first supply voltage, the first power supply connected to a first node, a second power supply that provides a second supply voltage, the second power supply connected to the first node, an inverter that receives an input voltage from the first node and produces an output voltage, and a resistor-capacitor (RC) circuit connected between the first node and a system ground, the RC circuit operating as a trigger that causes the input voltage to indicate occurrence of an ESD event, the method comprising:
  receiving an ESD strike at either the first power supply or the second power supply;
  driving, in response to the ESD strike, the output voltage to indicate the ESD event;
  receiving the output voltage at an ESD discharge device; and
  providing, in response to the output voltage, a discharge path for the first power supply and the second power supply.

18. The method of claim 17, comprising turning off the ESD discharge device when the output voltage no longer indicates the ESD event.

\* \* \* \* \*